United States Patent
Chen

(10) Patent No.: US 11,862,272 B2
(45) Date of Patent: Jan. 2, 2024

(54) METHOD AND DEVICE FOR DETERMINING FAIL BIT REPAIR SOLUTION, AND CHIP

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 318 days.

(21) Appl. No.: 17/402,758

(22) Filed: Aug. 16, 2021

(65) Prior Publication Data

US 2022/0068425 A1    Mar. 3, 2022

Related U.S. Application Data

(63) Continuation of application No. PCT/CN2021/100418, filed on Jun. 16, 2021.

(30) Foreign Application Priority Data

Sep. 1, 2020    (CN) .......................... 202010904166.1

(51) Int. Cl.
    *G11C 29/42*    (2006.01)
    *G11C 29/00*    (2006.01)
    *G11C 29/44*    (2006.01)

(52) U.S. Cl.
    CPC .......... *G11C 29/42* (2013.01); *G11C 29/4401* (2013.01); *G11C 29/72* (2013.01); *G11C 29/785* (2013.01)

(58) Field of Classification Search
    CPC ..... G11C 29/42; G11C 29/4401; G11C 29/72; G11C 29/785; G11C 29/835; G11C 29/838; G11C 29/808; G11C 29/814
    See application file for complete search history.

(56) References Cited

U.S. PATENT DOCUMENTS

| | | | |
|---|---|---|---|
| 5,978,931 | A | 11/1999 | Kirihata |
| 2001/0044916 | A1 | 11/2001 | Blodgett |
| 2003/0154422 | A1 | 8/2003 | Blodgett |
| 2004/0223387 | A1 | 11/2004 | Frankowsky |
| 2005/0193241 | A1 | 9/2005 | Blodgett |

(Continued)

FOREIGN PATENT DOCUMENTS

| | | |
|---|---|---|
| CN | 1106018 C | 4/2003 |
| CN | 101303899 A | 11/2008 |

(Continued)

OTHER PUBLICATIONS

Supplementary European Search Report in the European application No. 21773271.8, dated Jun. 6, 2023, 9 pages.

(Continued)

*Primary Examiner* — Mohammed A Bashar
(74) *Attorney, Agent, or Firm* — Cooper Legal Group, LLC

(57) ABSTRACT

A local region to be repaired including the fail bit is determined. A preliminary repair LR circuit for repairing the local region to be repaired is determined (S210). A region level of the local region to be repaired is determined (S230) according to the number of available GR circuits other than any replacement GR circuit configured for replacing the preliminary repair LR circuit and the number of available LR circuits. It is controlled, according to the region level of the local region to be repaired, to repair the fail bit by the GR circuit or the LR circuit (S240).

20 Claims, 6 Drawing Sheets

(56) References Cited

U.S. PATENT DOCUMENTS

| | | |
|---|---|---|
| 2008/0080275 A1 | 4/2008 | Jeong |
| 2008/0282107 A1 | 11/2008 | Hung |
| 2009/0100291 A1 | 4/2009 | Blodgett |
| 2011/0090751 A1 | 4/2011 | Manna |
| 2011/0099417 A1 | 4/2011 | Blodgett |
| 2013/0010538 A1 | 1/2013 | Blodgett |
| 2013/0021859 A1 | 1/2013 | Shvydun |
| 2013/0021860 A1 | 1/2013 | Shvydun |
| 2013/0021861 A1 | 1/2013 | Shvydun |
| 2013/0301369 A1 | 11/2013 | Shvydun |
| 2014/0082453 A1 | 3/2014 | Sikdar |

FOREIGN PATENT DOCUMENTS

| | | |
|---|---|---|
| CN | 106158041 A | 11/2016 |
| CN | 110010187 A | 7/2019 |
| CN | 110364214 A | 10/2019 |
| CN | 110729017 A | 1/2020 |
| CN | 110968985 A | 4/2020 |
| CN | 111178374 A | 5/2020 |
| CN | 111415700 A | 7/2020 |
| KR | 20190093358 A | 8/2019 |
| WO | 2011037758 A1 | 3/2011 |
| WO | 2014047225 A1 | 3/2014 |

OTHER PUBLICATIONS

International Search Report in the international application No. PCT/CN2021/100418, dated Aug. 30, 2021, 3 pages.

English translation of the Written Opinion of the International Search Authority in the international application No. PCT/CN2021/100418, dated Aug. 31, 2021, 3 pages.

Notice of Allowance of the Chinese application No. 202010904166.1, dated Jun. 12, 2023, 5 pages with English translation.

METHOD AND DEVICE FOR DETERMINING FAIL BIT REPAIR SOLUTION, AND CHIP

CROSS-REFERENCE TO RELATED APPLICATION

This is a continuation application of International Patent Application No. PCT/CN2021/100418, filed on Jun. 16, 2021, which claims benefit of priority to Chinese Application No. 202010904166.1, filed on Sep. 01, 2020 and titled "METHOD AND DEVICE FOR DETERMINING FAIL BIT REPAIR SOLUTION, AND CHIP". The entire contents of International Patent Application No. PCT/CN2021/100418 and Chinese Application No. 202010904166.1 are incorporated herein by reference in their entireties

TECHNICAL FIELD

The present disclosure relates to the field of integrated circuit technology, and more particularly, to a method and device for determining a fail bit repair solution, and a chip.

BACKGROUND

With rapid development of computer technology, an integrated circuit chip plays an increasingly important role in daily production and life. However, a failure problem produced during development, production, and use of a chip is inevitable. Generally, a fail bit in a chip may be repaired using a redundancy circuit.

A Repair Algorithm (RA) is a method that can effectively assign different types of redundancy circuits to repair a line where the fail bit is located.

However, with an existing RA, after repair has been performed once, it often occurs that Local Redundancy (LR) circuits are scarce or lacking, such that a next repair cannot be performed, thereby rendering the chip useless.

SUMMARY

According to one aspect of the present disclosure, a method for determining a fail bit repair solution is provided. The method is applied to a chip including a plurality of local regions. The chip further includes Global Redundancy (GR) circuits and Local Redundancy (LR) circuits. The GR circuits are configured to repair a fail bit in any of the local regions. The LR circuits are configured to repair the fail bit in a designated local region. The method includes:

determining a local region to be repaired including the fail bit, and determining a preliminary repair LR circuit for repairing the local region to be repaired;

acquiring a number of available GR circuits other than any replacement GR circuit configured for replacing the preliminary repair LR circuit and a number of available LR circuits designated for repairing the local region to be repaired;

determining, according to the number of available GR circuits other than the any replacement GR circuit and the number of available LR circuits, a region level of the local region to be repaired; and according to the region level of the local region to be repaired, controlling repair of the fail bit by the any replacement GR circuit in place of the preliminary repair LR circuit, or controlling repair of the fail bit by the preliminary repair LR circuit.

According to one aspect of the present disclosure, a device for determining a fail bit repair solution is provided. The device is applied to a chip including a plurality of local regions. The chip further includes Global Redundancy (GR) circuits and Local Redundancy (LR) circuits. The GR circuits are configured to repair a fail bit in any of the local regions. The LR circuits are configured to repair the fail bit in a designated local region of the local regions. The device includes a region determining module, a number acquiring module, a region level determining module, and a repair solution determining module.

The region determining module is configured to determine a local region to be repaired including the fail bit, and determine a preliminary repair LR circuit for repairing the local region to be repaired.

The number acquiring module is configured to acquire a number of available GR circuits other than any replacement GR circuit configured for replacing the preliminary repair LR circuit and a number of available LR circuits designated for repairing the local region to be repaired.

The region level determining module is configured to determine, according to the number of available GR circuits other than the any replacement GR circuit and the number of available LR circuits, a region level of the local region to be repaired.

The repair solution determining module is configured to, according to the region level of the local region to be repaired, control repair of the fail bit by the any replacement GR circuit in place of the preliminary repair LR circuit, or control repair of the fail bit by the preliminary repair LR circuit.

According to one aspect of the present disclosure, a chip is provided. The chip includes a normal unit region and a redundancy unit region.

The normal unit region includes a plurality of local regions.

The redundancy unit region includes Global Redundancy (GR) circuits and Local Redundancy (LR) circuits. The GR circuits and the LR circuits are constructed to repair a fail bit in the local regions based on any aforementioned method for determining a fail bit repair solution.

It should be understood that the general description above and the elaboration below are illustrative and explanatory only, and do not limit the present disclosure.

BRIEF DESCRIPTION OF THE DRAWINGS

The drawings, which are incorporated in and constitute a part of this specification, illustrate embodiments consistent with the present disclosure and, together with the description, serve to explain the principles of the present disclosure. It is clear that the drawings described below refer merely to some embodiments of the present disclosure. A person having ordinary skill in the art may acquire other drawings according to the drawings here without creative effort.

DETAILED DESCRIPTION

Figure 1:
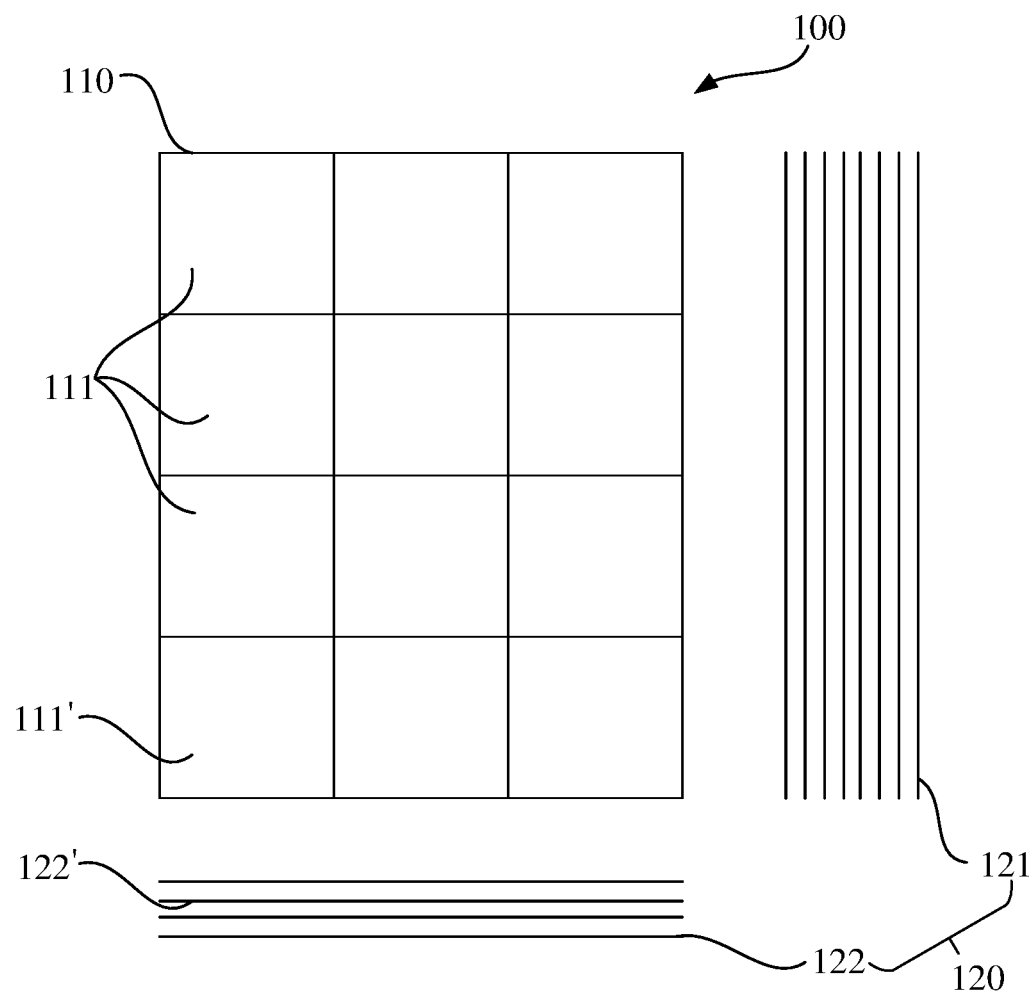
FIG. 1 is a diagram of a structure of a chip according to illustrative implementation of the present disclosure.

Illustrative embodiments will be described more comprehensively with reference to the drawings. However, the illustrative embodiments can be implemented in many forms, and should not be construed as being limited to examples illustrated here. Instead, by providing these embodiments, the present disclosure may become more comprehensive and complete, and concept of the illustrative embodiments may be delivered comprehensively to a skilled person in the art. Same reference signs in the drawings represent the same or similar structures, so that description of them will not be repeated.

Although relative terms, such as "upper" and "lower", are used in the specification to describe the relation between one component and another illustrated, these terms are used in the specification merely for convenience, such as according to the direction of the example in the drawings. It may be understood that if the illustrated device is flipped to make it upside down, then the described "upper" component will become a "lower" component. Other relative terms, such as "high", "low", "top", "bottom", "left", and "right", also have similar meanings. When a certain structure is "on" another structure, it may mean that the certain structure is integrally formed on the other structure, or the certain structure is "directly" arranged on the other structure, or the certain structure is "indirectly" arranged on the other structure through yet another structure.

Terms "one", "a", and "the" are used to indicate that there is one or more elements/component distinctions/etc. Terms "include/comprise" and "have/has" are used to indicate open inclusion, and refer to that there may also be other elements/component distinctions/etc., in addition to the listed elements/component distinctions/etc.

A chip may generally contain a plurality of bits. For example, a typical dynamic random access memory chip has up to 64 million bits. These bits may be arranged in rows and columns, forming a primary array, which facilitates addressing through word lines and bit lines.

In manufacturing a typical dynamic random access memory chip, a million or millions of bits in the primary array may be flawed, i.e., so called fail bits. In order to improve chip yield, redundant bits are generally made on a chip. These redundant bits may replace flawed fail bits, thereby bypassing these flawed fail bits and allowing a memory circuit to be used normally.

Generally, when fail bits are produced during chip development, production, and use, the fail bits in a chip may be subjected to repair processing through redundancy circuits. In view that with an existing RA, after repair has been performed once, it often occurs that Local Redundancy (LR) circuits are scarce or lacking, such that a next repair cannot be performed, even rendering the chip useless, in the present illustrative implementation, a method for determining a fail bit repair solution is provided.

Referring to FIG. 1, a diagram of a structure of a chip according to illustrative implementation of the present disclosure is shown. As a chip 100 includes a large number of bits, in order to improve repair efficiency, a primary array, namely, a normal unit region 110, of the chip may be divided into a plurality of local regions 111. Each local region 111 may include a certain number of bits. Meanwhile, in addition to the normal unit region 110, a redundancy unit region 120 including redundant bits is also arranged on the chip 100. The redundancy unit region 120 includes Global Redundancy (GR) circuits 121 and Local Redundancy (LR) circuits 122. The GR circuit 121 may be configured to repair a fail bit in any of the local regions 111. The LR circuit 122 may be configured to repair a fail bit in a designated local region 111. For example, as shown in FIG. 1, an LR circuit 122' can just repair a fail bit in a local region 111'.

Optionally, as shown in FIG. 1, a GR circuit 121 is a column redundancy circuit and may be configured to replace a word line, so as to repair a fail bit on the word line. One GR circuit 121 may simultaneously repair a plurality of fail bits on one word line. A LR circuit 122 may be a row redundancy circuit, and may be configured to replace a bit line, so as to repair a fail bit on the bit line. In addition, one LR circuit 122 may simultaneously repair a plurality of fail bits on one bit line.

Figure 2:
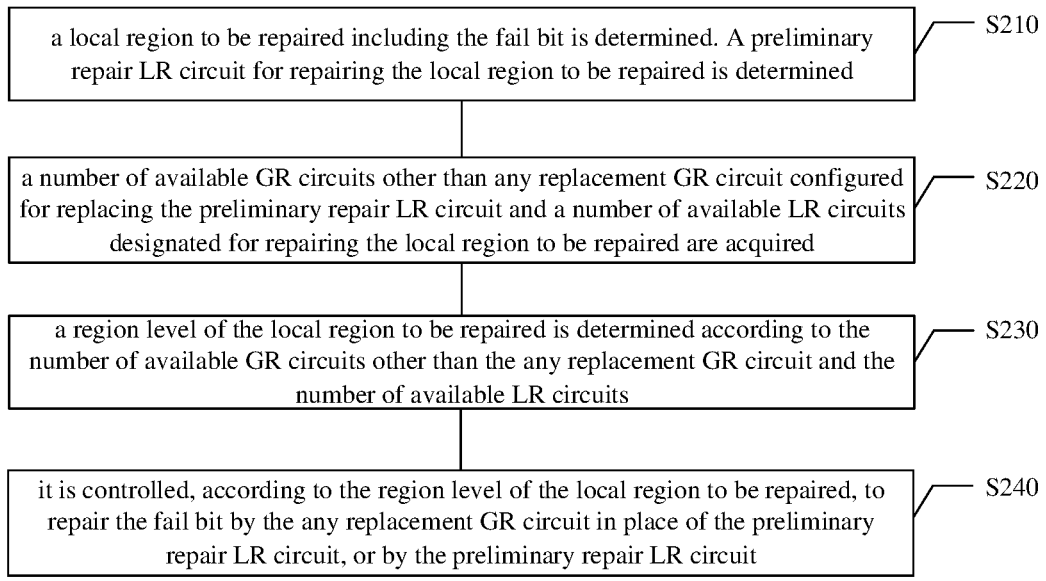
FIG. 2 is a flowchart of a method for determining a fail bit repair solution according to illustrative implementation of the present disclosure.

FIG. 2 is a flowchart of a method for determining a fail bit repair solution according to illustrative implementation of the present disclosure. Referring to FIG. 2, the method for determining a fail bit repair solution may include a step as follows.

In S210, a local region to be repaired including the fail bit is determined. A preliminary repair LR circuit for repairing the local region to be repaired is determined.

In S220, a number of available GR circuits other than any replacement GR circuit configured for replacing the preliminary repair LR circuit and a number of available LR circuits designated for repairing the local region to be repaired are acquired.

In S230, a region level of the local region to be repaired is determined according to the number of available GR circuits other than the any replacement GR circuit and the number of available LR circuits.

In S240, it is controlled, according to the region level of the local region to be repaired, to repair the fail bit by the any replacement GR circuit in place of the preliminary repair LR circuit, or by the preliminary repair LR circuit.

According to the method for determining a fail bit repair solution in the present illustrative embodiment, in one aspect, the number of GR circuits remaining available other than the any GR circuit that may later serve as replacement may be estimated preliminarily in advance by acquiring the number of available GR circuits other than the any replacement GR circuit, so as to ensure that after repair has been performed once, the number of GR circuits remaining available are sufficient to provide for a next fail bit repair, to improve chip process yield. In another aspect, region level division is performed on the local region to be repaired, and it may be controlled, according to the region level, to repair the fail bit by a GR circuit in place of an LR circuit, avoiding a state caused by repairing fail bits completely using LR circuits, where after repair has been performed once, the number of available LR circuits for most local regions are scarce or lacking, achieving a balance in fail bit repair, ensuring that there is an LR circuit available for each local region in the next repair, improving repair yield. In yet another aspect, after repair has been performed once with the fail bit repair solution, both the number of GR circuits remaining available and the number of available LR circuits remaining may allow a next repair, thereby improving the probability that the fail bits may be repaired completely, and reduces reducing the probability that the next repair cannot be performed, thereby effectively improving chip process yield, reducing the chance of a chip turning useless.

The method for determining a fail bit repair solution in the present illustrative embodiment will be elaborated below.

In S210, a local region to be repaired including the fail bit is determined. A preliminary repair LR circuit for repairing the local region to be repaired is determined.

In some illustrative implementations of the present disclosure, the local region to be repaired may be a local region 111 including a fail bit in the normal unit region 110. A local region to be repaired may include a plurality of fail bits, and the plurality of fail bits may be located on the same bit line, or may be located on different bit lines.

For one local region to be repaired, a preliminary repair LR circuit, for repairing a bit line including a fail bit in the local region to be repaired, may be determined. When a plurality of LR circuits are designated for repairing the local region to be repaired, the preliminary repair LR circuit may be any one of the plurality of LR circuits.

In some illustrative implementations of the present disclosure, it may require just one LR circuit for repairing a plurality of fail bits located on the same bit line. It may require a plurality of LR circuits for repairing a plurality of fail bits located on different bit lines. However, each LR circuit implements replacement in the same mode. With the present illustrative implementation, one LR circuit is taken as an example to determine a fail bit repair solution, and implementation for the other cases is similar.

It is to be noted that it does not mean that the fail bit will ultimately be repaired using the preliminary repair LR circuit determined here. The fail bit may be repaired using a GR circuit in place of the preliminary repair LR circuit.

In S220, a number of available GR circuits other than any replacement GR circuit configured for replacing the preliminary repair LR circuit and a number of available LR circuits designated for repairing the local region to be repaired are acquired.

In some illustrative implementations of the present disclosure, rather than repairing fail bits using just the LR circuits, both the number of available GR circuits and the number of available LR circuits will be considered, thereby determining a new repair solution, such that a balance between the amount of GR circuits used and the amount of LR circuits used is achieved, avoiding excessive use of either one of the GR circuits or the LR circuits, providing an amount of circuits sufficient to support a next fail bit repair, thereby improving chip process yield, reducing the chance of a chip turning useless.

Here, rather than acquiring the number of any available GR circuit, the number of available GR circuits other than the any replacement GR circuit configured for replacing the preliminary repair LR circuit is acquired, avoiding a failure in a next chip repair due to that no GR circuit is left as all GR circuits have been used up for fail bit repair. In addition, in another case, if there are a lot of fail bits and the fail bits are located on the same bit line, and the GR circuits are column redundancy circuits, i.e., one GR circuit can repair but one fail bit on one bit line, so that there may not be enough GR circuits if repair is implemented using GR circuits. For example, there are 100 fail bits on one bit line, while there are just 64 GR circuits. Then, if repair is implemented using GR circuits in place of LR circuits, not all fail bits can be repaired, thereby rendering the entire chip useless. Therefore, with the illustrative implementation, the number of available GR circuits other than the any replacement GR circuit (i.e., the number of GR circuits remaining available after the any replacement GR circuit has been used to repair the any fail bit in place of the LR circuits) is acquired as a parameter for evaluating the local region to be repaired, improving the effectiveness of the repair solution.

Specifically, the number of available GR circuits other than the any replacement GR circuit is a difference between a number of available GR circuits and a number of fail bits repairable by the preliminary repair LR circuit. The LR circuits are row redundancy circuits and the GR circuits are column redundancy circuits. Therefore, the number of fail bits repairable by the preliminary repair LR circuit is the number of GR circuits required for repair in place of the preliminary repair LR circuit. The number of GR circuits remaining available, supposing that repair has been implemented using the any replacement GR circuit in place of the preliminary repair LR circuit, is the number acquired by subtracting the number of GR circuits required from the number of available GR circuits.

With the method for determining a fail bit repair solution in the present illustrative embodiment, a number of available GR circuits other than any replacement GR circuit configured for replacing the preliminary repair LR circuit is evaluated. Repair is not implemented using GR circuits in replace of the preliminary repair LR circuit, unless there is a redundant number of GR circuits remaining available, supposing that repair has been implemented using the any replacement GR circuit in place of the preliminary repair LR circuit. This ensures that there are GR circuits available for a next fail bit repair, ensuring effective implementation of the next repair, improving chip process yield.

In S230, a region level of the local region to be repaired is determined according to the number of available GR circuits other than any replacement GR circuit configured for replacing the preliminary repair LR circuit and the number of available LR circuits.

In some illustrative implementations of the present disclosure, region level division is performed on the local region to be repaired according to the number of available GR circuits other than any replacement GR circuit configured for replacing the preliminary repair LR circuit and the number of available LR circuits, so that a repair solution may be determined according to the actual case of each local region to be repaired. That is, a repair solution is determined according to the number of available GR circuits other than the any replacement GR circuit and the number of available LR circuits, so that the repair is more reasonable, improving the probability that all fail bits on the chip be repaired.

In S240, it is controlled, according to the region level of the local region to be repaired, to repair the fail bit by the any replacement GR circuit in place of the preliminary repair LR circuit, or by the preliminary repair LR circuit.

It may be known from the above that different repair solutions may be determined depending on the region level of the local region to be repaired, i.e., the repair solution may be determined according to the actual case of the local region to be repaired. For example, the repair solution is determined according to the number of available GR circuits, the number of fail bits, and the number of LR circuits, which improves the probability that all fail bits be repaired.

In some illustrative implementations of the present disclosure, the region level includes a free region and a restricted region. A free region refers to a region in which a fail bit may be repaired using the any replacement GR circuit in place of the preliminary repair LR circuit. When the region level of the local region to be repaired is the free region, it may be controlled to repair the fail bit by the any replacement GR circuit in place of the preliminary repair LR circuit. That is, a better effect may be achieved by performing fail bit repair on a local region determined as the free region using GR circuits than using LR circuits. For example, it ensures that there are sufficient LR circuits available for the next repair when there are a sufficient number of GR circuits available.

A restricted region refers to a region in which a fail bit may be repaired directly using the preliminary repair LR circuit. When the region level of the local region to be repaired is the restricted region, it may be controlled to repair the fail bit by the preliminary repair LR circuit. That is, a fail bit in a local region determined as the restricted region is repaired using an LR circuit. The repair solution for this region is restricted and cannot be replaced. There are a sufficient number of LR circuits designated for repairing this local region, or for this local region, fail bit repair may be implemented using less LR circuits than GR circuits, which reduces the cost of repair, and ensures that sufficient GR circuits may be provided for next repair.

In some illustrative implementations of the present disclosure, the region level of the local region to be repaired is determined via a decision support function according to the number of available GR circuits other than the any replacement GR circuit and the number of available LR circuits.

Optionally, the decision support function $f_{DSS}(g,l)$ is as shown in the formula (1).

$$f_{DSS}(g, l) = \begin{cases} \text{restricted region,} & (g \leq g^L) \text{ or } (g^L < g < g^H, l \geq l^H) \text{ or } (g^L < g \leq g^M, l^M \leq l < l^H) \\ \text{free region,} & (g \geq g^H) \text{ or } (g^L < g < g^H, l \leq l^L) \text{ or } (g^M < g \leq g^H, l^L < l < l^M) \\ \text{disputed region,} & (g^L < g < g^M, l^L < l < l^M) \text{ or } (g^M < g < g^H, l^M < l < l^H) \end{cases} \quad (1)$$

The g represents a number of available GR circuits other than the any replacement GR circuit configured for replacing the preliminary repair LR circuit (available GR for short). The l represents the number of available LR circuits (available LR for short). The $g^L$ represents a low number of available GRs. The $g^M$ represents an ideal number of available GRs. The $g^H$ represents a high number of available GRs. The $l^L$ represents a low number of available LRs. The $l^M$ represents an ideal number of available LRs. The $l^H$ represents a high number of available LRs.

In actual application, the $g^L$, $g^M$, $g^H$, $l^L$, $l^M$ and $l^H$ are all reference values, specific values of which may be set according to an actual case. For example, the low number of available GRs may be half the available GRs, the high number of available GRs may be ⅔ the available GRs. The ideal number of available GRs may be the mean value of the low number of available GRs and the high number of available GRs. Similarly, the low number of available LRs may be half the available LRs, the high number of available LRs may be ⅔ the available LRs, and the ideal number of available LRs may be the mean value of the low number of available LRs and the high number of available LRs. Specific sizes of the reference values are not limited in the present illustrative embodiment.

Figure 3:
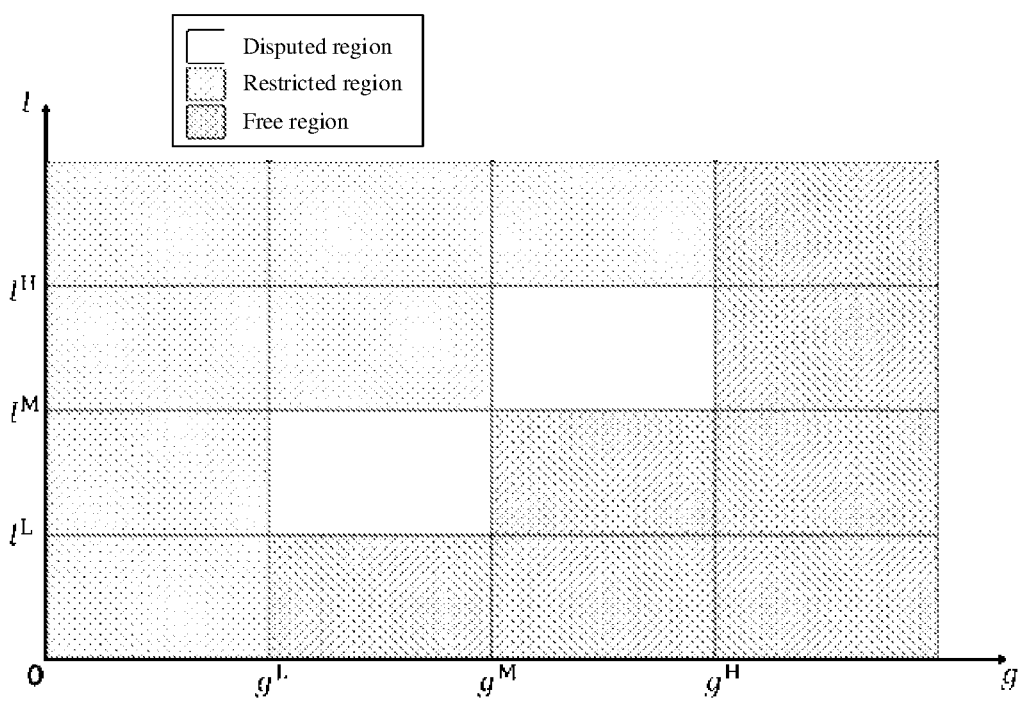
FIG. 3 is a diagram of distribution of region levels of local regions to be repaired according to illustrative implementation of the present disclosure.

In some illustrative implementations of the present disclosure, as shown in FIG. 3, the region level of the local region to be repaired, determined via by the decision support function $f_{DSS}(g,l)$ includes a restricted region, a free region, and a disputed region. When it is determined that the region level of the local region to be repaired is the disputed region, the disputed region may further be determined to be the free region or the restricted region via a fuzzy inference function.

In some illustrative implementations of the present disclosure, the fuzzy inference function may be determined according to a restricted region fuzzy set and a free region fuzzy set. When the free region fuzzy set is less than the restricted region fuzzy set, the disputed region determined by the fuzzy inference function may be the restricted region. When the free region fuzzy set is greater than or equal to the restricted region fuzzy set, the disputed region determined by the fuzzy inference function may be the free region.

Specifically, the fuzzy inference function $f_{\tilde{G}\tilde{L}}(g,l)$ may be expressed by formula (2) as follows.

$$f_{\tilde{G}\tilde{L}}(g, l) = \begin{cases} \text{restricted region,} & (f_{\tilde{G}}(g) < f_{\tilde{L}}(l)), \\ \text{free region,} & (f_{\tilde{G}}(g) \leq f_{\tilde{L}}(l)). \end{cases} \quad (2)$$

The $f_{\tilde{G}}(g)$ is the free region fuzzy set. The $f_{\tilde{L}}(l)$ is the restricted region fuzzy set.

In some illustrative implementations of the present disclosure, the free region fuzzy set $f_{\tilde{G}}(g)$ is determined by a range ratio of the number of available GR circuits other than the any replacement GR circuit to a total number of GR circuits (GR range ratio for short). The restricted region fuzzy set $f_{\tilde{L}}(l)$ is determined by a range ratio of the number of available LR circuits to a total number of LR circuits (LR range ratio for short).

Figure 4:
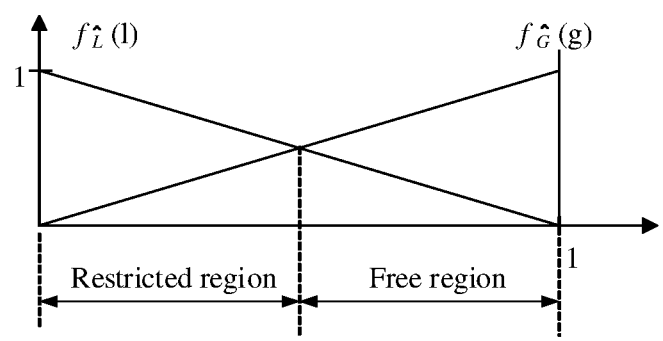
FIG. 4 is a diagram of coordinates of a fuzzy inference function according to illustrative implementation of the present disclosure.

FIG. 4 is a diagram of coordinates of a fuzzy inference function. When the free region fuzzy set $f_{\tilde{G}}(g)$ is less than the restricted region fuzzy set $f_{\tilde{L}}(l)$, that is, when the GR range ratio is less than the LR range ratio, the disputed region is the restricted region. When the free region fuzzy set $f_{\tilde{G}}(g)$ is greater than or equal to the restricted region fuzzy set $f_{\tilde{L}}(l)$, that is, when the GR range ratio is greater than or equal to the LR range ratio, the disputed region is the free region.

Specifically, the free region fuzzy set $f_{\tilde{G}}(g)$ may be expressed by formula (3) as follows.

$$f_{\tilde{G}}(g) = \begin{cases} (g - g^L)(g^M - g^L)^{-1}, & (g^L \leq g < g^M) \\ (g - g^M)(g^H - g^M)^{-1}, & (g^M \leq g < g^H) \\ 0, & \text{(otherwise)} \end{cases} \quad (3)$$

The restricted region fuzzy set $f_{\tilde{L}}(l)$ may be expressed by formula (4) as follows.

$$f_{\tilde{L}}(g) = \begin{cases} 1 - (l - l^L)(l^M - l^L)^{-1}, & (l^L \leq l < l^M) \\ 1 - (l - l^M)(l^H - l^M)^{-1}, & (l^M \leq l < l^H) \\ 0, & \text{(otherwise)} \end{cases} \quad (4)$$

A range ratio is the distance between a number x and a nearest lower bound nearest to the x, divided by the distance between a nearest upper bound nearest to the x and the nearest lower bound. Taking the number of available LRs l as an example, when $l^L \leq l < l^M$, the nearest lower bound of l the is $l^L$, and the nearest lower bound and the nearest upper bound of the l are and $l^L$ $l^M$, respectively. Then, the range ratio is $(l–l^L)(l^M–l^L)^{-1}$.

With the method for determining a fail bit repair solution in the present illustrative embodiment, after a free region and a restricted region have been determined via a decision support function, a disputed region is further determined via a fuzzy inference function to determine whether the disputed region is the free region or the restricted region so as to determine the region level of the local region to be repaired, which improves the precision in region level division, thereby ensuring the effectiveness of the whole fail bit repair solution, providing a new solution for determining fail bit repair, further improving the effectiveness of the fail bit repair, avoiding the case that the quantities of the GR circuits and the LR circuits are insufficient, providing the basis for the next repair.

Figure 5:
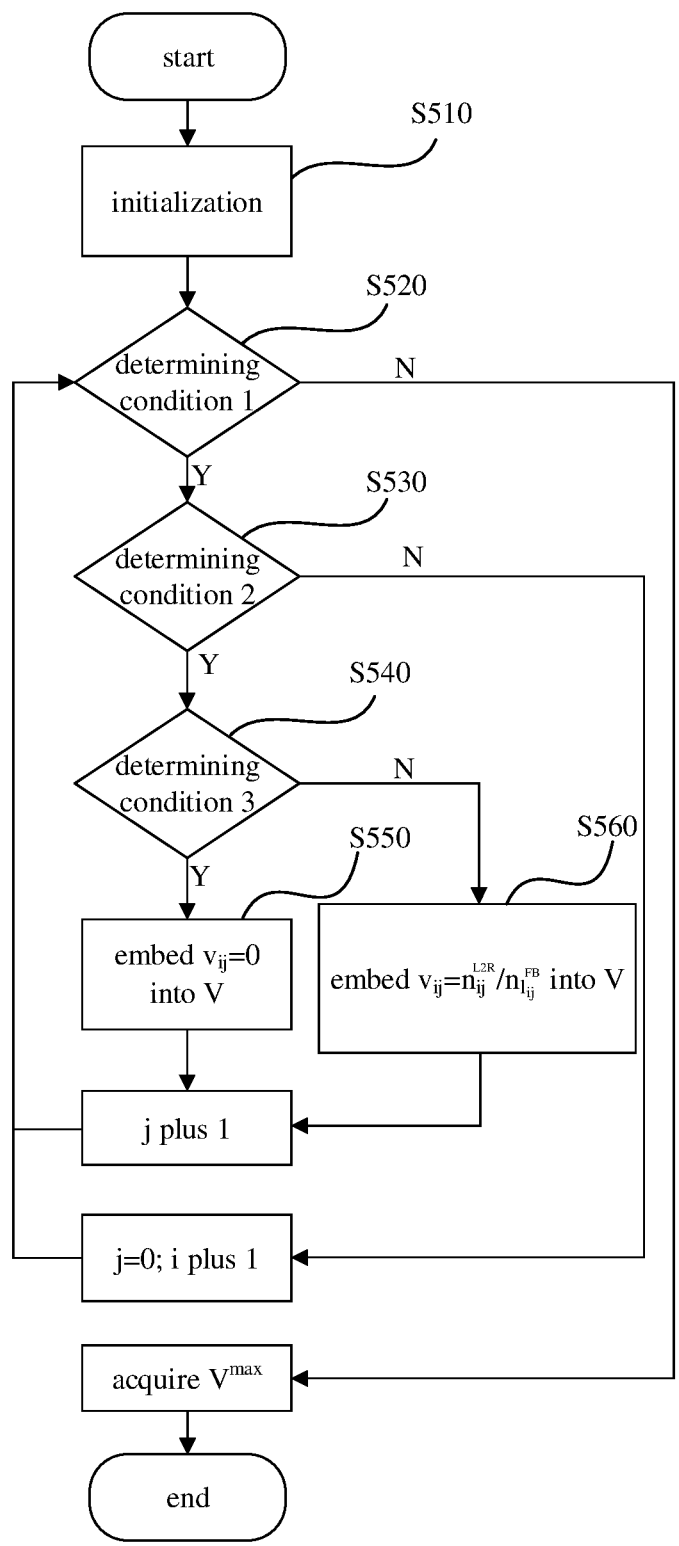
FIG. 5 is a flowchart of acquiring an LR priority replacement list according to illustrative implementation of the present disclosure.

Refer to FIG. 5. FIG. 5 is a flowchart of acquiring an LR priority replacement list according to illustrative implementation of the present disclosure. The LR priority replacement list refers to the priority replacement list of LR circuits that may be replaced by GR circuits in repair.

In S510, an initialization processing operation may be performed first to initialize the i of the ith local region to be observed as i=0, and the j of the jth assigned LR circuit to be observed in the ith local region as j=0. Meanwhile, an empty vector V may be provided. After the initialization has completed, S520 is executed to determine whether the ith local region exists, using a determination condition 1 of whether the i<the total quantity of local regions. If the determination condition 1 is met, S530 is executed to determine whether the jth assigned LR circuit actually exists, using a determination condition 2 of whether the jth LR circuit belongs to the set of assigned LR circuits. If the determination condition 2 is met, S540 is executed to determine whether the ith local region is the restricted region, using a determination condition 3 of whether the result of the decision support function is the restricted region. If the determination condition 3 is met, S550 is executed to embed $v_{ij}=0$ into the vector V. If the determination condition 3 is not met, S560 is executed to embed the $v_{ij}=n_{ij}^{L2R}/n_{ij}^{FB}$ the vector V. The $n_{ij}^{L2R}$ is the number of GR circuits required to replace the assigned LR circuits. The $n_{ij}^{FB}$ is the number of fail bits repairable by the jth LR in the ith local region. After S550 or S560 has been completed, the j is increased by 1, and S520 is performed to enter the next determination cycle. If the determination condition 2 is not met, j=0 is set, the i is increased by 1, and S520 is performed to enter the next determination cycle. If the determination condition 1 is not met, the maximum value $v^{max}$ in the vector V is determined. Through the cyclic determination, a vector of maximum value $v^{max}$, i.e., the LR priority replacement list, may be acquired in the end. The jth LR circuit in the ith local region designated by the $v^{max}$ may be replaced with GR circuit according to the priority replacement list.

It is noted that preliminary assignment of the LR circuits may be performed according to a Repair Algorithm RA.

To sum up, a local region to be repaired including the fail bit is determined. It is determined, according to a decision support function, whether the local region to be repaired is a free region that may be repaired by a GR circuit in place of an LR circuit, or the local region to be repaired is a restricted region that can be repaired using just an LR circuit. If the local region to be repaired is a disputed region, then it is further determined, using a fuzzy inference function, whether the disputed region is the free region or the restricted region, which provides reliable basis for determining a fail bit repair solution, improving the effectiveness of the repair. In this way, after repair is performed once with the fail bit repair solution, both the number of available GR circuits remaining and the number of available LR circuits remaining may meet the next repair, which improves the probability of all fail bits being repaired, reducing the probability that the next repair cannot be performed, thereby effectively improving chip process yield, reducing the chance of a chip turning useless.

It is noted that although in the drawings, steps of the method of the present disclosure are described in a specific order, it is not required or suggested that the steps must be executed in the specific order, or that all the steps shown must be executed to achieve the desired result. Additionally or alternatively, some steps may be omitted, multiple steps may be combined into one step for execution, and/or one step may be decomposed into multiple steps for execution, etc.

Figure 6:
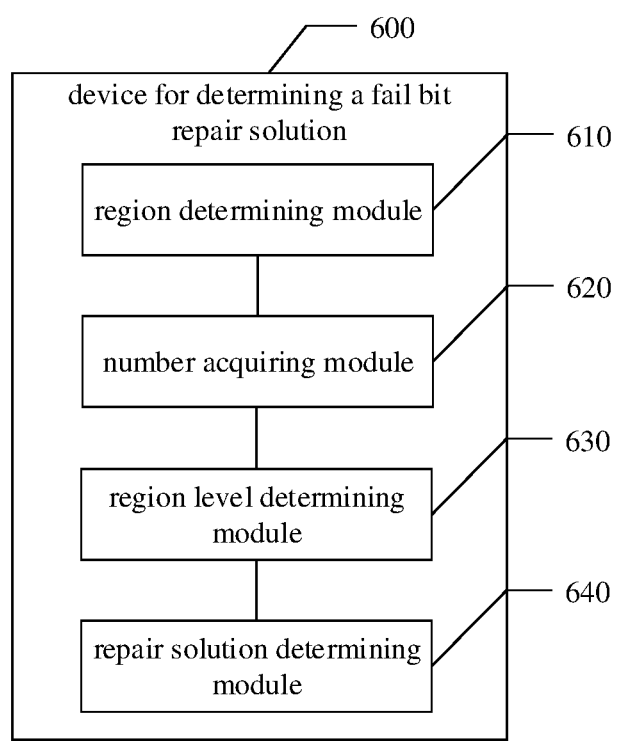
FIG. 6 is a block diagram of a device for determining a fail bit repair solution according to illustrative implementation of the present disclosure.

In addition, in the present illustrative embodiment, a device for determining a fail bit repair solution is further provided. The device is applied to a chip including a plurality of local regions. The chip further includes Global Redundancy (GR) circuits and Local Redundancy (LR) circuits. The GR circuits are configured to repair a fail bit in any of the local regions. The LR circuits are configured to repair the fail bit in a designated local region. Referring to FIG. 6, the device 600 for determining a fail bit repair solution may include a region determining module 610, a number acquiring module 620, a region level determining module 630, and a repair solution determining module 640.

The region determining module 610 is configured to determine a local region to be repaired including the fail bit, and determine a preliminary repair LR circuit for repairing the local region to be repaired.

The number acquiring module 620 is configured to acquire a number of available GR circuits other than any replacement GR circuit configured for replacing the preliminary repair LR circuit and a number of available LR circuits designated for repairing the local region to be repaired.

The region level determining module 630 is configured to determine, according to the number of available GR circuits other than the any replacement GR circuit and the number of available LR circuits, a region level of the local region to be repaired.

The repair solution determining module 640 is configured to, according to the region level of the local region to be repaired, control repair of the fail bit by the any replacement GR circuit in place of the preliminary repair LR circuit, or control repair of the fail bit by the preliminary repair LR circuit.

Specific details of virtual modules of an aforementioned device for determining a fail bit repair solution have been elaborated in a method for determining a fail bit repair solution corresponding to the device, and will not be elaborated here.

It should be noted that although a number of modules or units of the device for determining a fail bit repair solution are mentioned in the above detailed description, such a division is not mandatory. As a matter of fact, according to implementation of the present disclosure, features and functions of two or more modules or units described above may be concretized in one module or unit. On the contrary, the feature and function of one module or unit described above may further be divided to be concretized by multiple modules or units.

In the illustrative embodiments of the present disclosure, a chip is further provided. Referring to FIG. 1, the structure of the chip 100 is shown. The chip 100 includes: a normal unit region 110, including a plurality of local regions 111; and a redundancy unit region 120, including GR circuits 121 and LR circuits 122. The GR circuits 121 and the LR circuits 122 are constructed to repair a fail bit in the local regions 111 based on the method for determining a fail bit repair solution. The method for determining a fail bit repair solution has been elaborated in previously described embodiments, and therefore will not be elaborated here.

In addition, the drawings are just illustrative description of processing included in the method according to illustrative embodiments of the present disclosure, and are not intended for limitation. It is easy to understand that processing shown in the drawings do not indicates or defines the time sequence of such processing. In addition, it is also easy to understand that such processing may be performed synchronously or asynchronously such as in a plurality of modules.

Other implementations of the present disclosure will be apparent to a person having ordinary skill in the art that has considered the specification and practiced the present disclosure. The present disclosure is intended to cover any variation, use, or adaptation of the present disclosure following the general principles of the present disclosure and including such departures from the present disclosure as come within common knowledge or customary practice in the art. The specification and the embodiments are intended to be illustrative only, with a true scope and spirit of the present disclosure being indicated by the appended claims.

It should be understood that the present disclosure is not limited to the exact construction that has been described above and illustrated in the drawings, and that various modifications and changes can be made to the present disclosure without departing from the scope of the present disclosure. It is intended that the scope of the present disclosure is defined only by the appended claims.

The invention claimed is:

1. A method for determining a fail bit repair solution, applied to a chip comprising a plurality of local regions, the chip further comprising Global Redundancy (GR) circuits and Local Redundancy (LR) circuits, the GR circuits being configured to repair a fail bit in any of the local regions, the LR circuits being configured to repair the fail bit in a designated local region of the local regions, the method comprising:
   determining a local region to be repaired comprising the fail bit, and determining a preliminary repair LR circuit for repairing the local region to be repaired;
   acquiring a number of available GR circuits other than any replacement GR circuit configured for replacing the preliminary repair LR circuit and a number of available LR circuits designated for repairing the local region to be repaired;
   determining, according to the number of available GR circuits other than the any replacement GR circuit and the number of available LR circuits, a region level of the local region to be repaired; and
   according to the region level of the local region to be repaired, controlling repair of the fail bit by the any replacement GR circuit in place of the preliminary repair LR circuit, or controlling repair of the fail bit by the preliminary repair LR circuit.

2. The method of claim 1, wherein the region level comprises a free region and a restricted region,
   wherein the according to the region level of the local region to be repaired, controlling repair of the fail bit by the any replacement GR circuit in place of the preliminary repair LR circuit, or controlling repair of the fail bit by the preliminary repair LR circuit comprises:
   in response to the region level of the local region to be repaired being the free region, controlling repair of the fail bit by the any replacement GR circuit in place of the preliminary repair LR circuit; and
   in response to the region level of the local region to be repaired being the restricted region, controlling repair of the fail bit by the preliminary repair LR circuit.

3. The method of claim 2, wherein the number of available GR circuits other than the any replacement GR circuit is a difference between a number of available GR circuits and a number of fail bits repairable by the preliminary repair LR circuit.

4. The method of claim 2, wherein determining, according to the number of available GR circuits other than the any replacement GR circuit and the number of available LR circuits, the region level of the local region to be repaired comprises:
   determining the region level of the local region to be repaired via a decision support function according to the number of available GR circuits other than the any replacement GR circuit and the number of available LR circuits.

5. The method of claim 4, wherein the decision support function $f_{DSS}(g,l)$ is:

$$f_{DSS}(g, l) = \begin{cases} \text{restricted region,} & (g \leq g^L) \text{ or } (g^L < g < g^H, l \geq l^H) \text{ or } (g^L < g \leq g^M, l^M \leq l < l^H) \\ \text{free region,} & (g \geq g^H) \text{ or } (g^L < g < g^H, l \leq l^L) \text{ or } (g^M < g \leq g^H, l^L < l < l^M) \\ \text{disputed region,} & (g^L < g < g^M, l^L < l < l^M) \text{ or } (g^M < g < g^H, l^M < l < l^H) \end{cases}$$

wherein the g represents a number of available GR circuits other than the any replacement GR circuit, the l represents the number of available LR circuits, the $g^L$ represents a low number of available GRs, the $g^M$ represents an ideal number of available GRs, the $g^B$ represents a high number of available GRs, the $l^L$ represents a low number of available LRs, the $l^M$ represents an ideal number of available LRs, and the $l^B$ represents a high number of available LRs.

6. The method of claim 5, wherein the region level of the local region to be repaired determined via the decision support function further comprises the disputed region,
   wherein in response to the region level of the local region to be repaired being the disputed region, the disputed region is determined to be the free region or the restricted region via a fuzzy inference function.

7. The method of claim 6, wherein the fuzzy inference function is determined according to a restricted region fuzzy set and a free region fuzzy set,
   wherein in response to the free region fuzzy set being less than the restricted region fuzzy set, the disputed region determined by the fuzzy inference function is the restricted region,
   wherein in response to the free region fuzzy set being greater than or equal to the restricted region fuzzy set, the disputed region determined by the fuzzy inference function is the free region.

8. The method of claim 7, wherein the restricted region fuzzy set is determined by a range ratio of the number of available LR circuits to a total number of LR circuits.

9. The method of claim 7, wherein the free region fuzzy set is determined by a range ratio of the number of available GR circuits other than the any replacement GR circuit to a total number of GR circuits.

10. The method of claim 1, wherein the GR circuits are column redundancy circuits, and the LR circuits are row redundancy circuits.

11. The method of claim 1, wherein in response to a plurality of LR circuits designated for repairing the local region to be repaired, the preliminary repair LR circuit is any one of the plurality of LR circuits.

12. A device for determining a fail bit repair solution, applied to a chip comprising a plurality of local regions, the chip further comprising Global Redundancy (GR) circuits and Local Redundancy (LR) circuits, the GR circuits being configured to repair a fail bit in any of the local regions, the LR circuits being configured to repair the fail bit in a designated local region of the local regions, the device comprising a processor and memory configured for storing instructions executable by the processor, wherein the processor is configured to execute the instructions stored in the memory to implement:
  determining a local region to be repaired comprising the fail bit, and determining a preliminary repair LR circuit for repairing the local region to be repaired;
  acquiring a number of available GR circuits other than any replacement GR circuit configured for replacing the preliminary repair LR circuit and a number of available LR circuits designated for repairing the local region to be repaired;
  determining, according to the number of available GR circuits other than the any replacement GR circuit and the number of available LR circuits, a region level of the local region to be repaired; and
  according to the region level of the local region to be repaired, controlling repair of the fail bit by the any replacement GR circuit in place of the preliminary repair LR circuit, or controlling repair of the fail bit by the preliminary repair LR circuit.

13. The device of claim 12, wherein the region level comprises a free region and a restricted region,
  wherein the processor is configured to implement, according to the region level of the local region to be repaired, controlling repair of the fail bit by the any replacement GR circuit in place of the preliminary repair LR circuit, or controlling repair of the fail bit by the preliminary repair LR circuit, by:
  in response to the region level of the local region to be repaired being the free region, controlling repair of the fail bit by the any replacement GR circuit in place of the preliminary repair LR circuit; and
  in response to the region level of the local region to be repaired being the restricted region, controlling repair of the fail bit by the preliminary repair LR circuit.

14. The device of claim 13, wherein the number of available GR circuits other than the any replacement GR circuit is a difference between a number of available GR circuits and a number of fail bits repairable by the preliminary repair LR circuit.

15. The device of claim 13, wherein the processor is configured to implement determining the region level of the local region to be repaired via a decision support function according to the number of available GR circuits other than the any replacement GR circuit and the number of available LR circuits.

16. The device of claim 15, wherein the decision support function $f_{DSS}(g,l)$ is:

$$f_{DSS}(g, l) = \begin{cases} \text{restricted region,} & (g \leq g^L) \text{ or } (g^L < g < g^H, l \geq l^H) \text{ or } (g^L < g \leq g^M, l^M \leq l < l^H) \\ \text{free region,} & (g \geq g^H) \text{ or } (g^L < g < g^H, l \leq l^L) \text{ or } (g^M < g \leq g^H, l^L < l < l^M) \\ \text{disputed region,} & (g^L < g < g^M, l^L < l < l^M) \text{ or } (g^M < g < g^H, l^M < l < l^H) \end{cases}$$

wherein the g represents a number of available GR circuits other than the any replacement GR circuit, the l represents the number of available LR circuits, the $g^L$ represents a low number of available GRs, the $g^M$ represents an ideal number of available GRs, the $g^H$ represents a high number of available GRs, the $l^L$ represents a low number of available LRs, the $l^M$ represents an ideal number of available LRs, and the $l^H$ represents a high number of available LRs.

17. The device of claim 16, wherein the region level of the local region to be repaired determined via the decision support function further comprises the disputed region,
  wherein in response to the region level of the local region to be repaired being the disputed region, the disputed region is determined to be the free region or the restricted region via a fuzzy inference function.

18. The device of claim 12, wherein the GR circuits are column redundancy circuits, and the LR circuits are row redundancy circuits.

19. The device of claim 12, wherein in response to a plurality of LR circuits designated for repairing the local region to be repaired, the preliminary repair LR circuit is any one of the plurality of LR circuits.

20. A chip, comprising:
  a normal unit region, comprising a plurality of local regions; and
  a redundancy unit region, comprising Global Redundancy (GR) circuits and Local Redundancy (LR) circuits, the GR circuits being configured to repair a fail bit in any of the local regions, the LR circuits being configured to repair the fail bit in a designated local region of the local regions, wherein the GR circuits and the LR circuits are constructed to repair a fail bit in the local regions by:
  determining a local region to be repaired comprising the fail bit, and determining a preliminary repair LR circuit for repairing the local region to be repaired;
  acquiring a number of available GR circuits other than any replacement GR circuit configured for replacing the preliminary repair LR circuit and a number of available LR circuits designated for repairing the local region to be repaired;
  determining, according to the number of available GR circuits other than the any replacement GR circuit and the number of available LR circuits, a region level of the local region to be repaired; and according to the region level of the local region to be repaired, controlling repair of the fail bit by the any replacement GR circuit in place of the preliminary repair LR circuit, or controlling repair of the fail bit by the preliminary repair LR circuit.

\* \* \* \* \*